(12) United States Patent
Li

(10) Patent No.: US 9,437,802 B2
(45) Date of Patent: Sep. 6, 2016

(54) MULTI-LAYERED THIN FILM PIEZOELECTRIC DEVICES AND METHODS OF MAKING THE SAME

(71) Applicant: Youming Li, San Jose, CA (US)

(72) Inventor: Youming Li, San Jose, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 397 days.

(21) Appl. No.: 13/972,814

(22) Filed: Aug. 21, 2013

(65) Prior Publication Data

US 2015/0054387 A1 Feb. 26, 2015

(51) Int. Cl.
| | |
|---|---|
| H01L 41/047 | (2006.01) |
| H01L 41/083 | (2006.01) |
| H01L 41/09 | (2006.01) |
| H01L 41/27 | (2013.01) |

(52) U.S. Cl.
CPC ......... *H01L 41/0471* (2013.01); *H01L 41/083* (2013.01); *H01L 41/0973* (2013.01); *H01L 41/27* (2013.01)

(58) Field of Classification Search
CPC ........... H01L 41/1876; H01L 41/0471; H01L 41/083; H01L 41/27
USPC ................ 310/324, 357, 363, 365, 366, 367
See application file for complete search history.

(56) References Cited

U.S. PATENT DOCUMENTS

| | | | |
|---|---|---|---|
| 5,527,741 A | 6/1996 | Cole et al. | |
| 6,584,861 B1 | 7/2003 | Jespersen | |
| 6,676,602 B1 | 1/2004 | Barnes et al. | |
| 6,894,425 B1 * | 5/2005 | Solomon | B06B 1/0629 |
| | | | 310/334 |
| 7,388,318 B2 * | 6/2008 | Yamada | H03H 3/02 |
| | | | 310/324 |
| 8,608,672 B2 | 12/2013 | Vortman et al. | |
| 9,096,422 B2 | 8/2015 | Hajit et al. | |
| 2002/0083771 A1 | 7/2002 | Khuri-Yakub et al. | |
| 2003/0187356 A1 | 10/2003 | Wakabayashi et al. | |
| 2004/0004649 A1 | 1/2004 | Bibl et al. | |
| 2005/0154312 A1 | 7/2005 | Bruestle | |

(Continued)

FOREIGN PATENT DOCUMENTS

JP 2001320103 11/2001

OTHER PUBLICATIONS

"PCT, International Search Report and Written Opinion of the International Searching Authority for International Application No. PCT/US2014/043893", (Oct. 14, 2014), Whole Document.

(Continued)

*Primary Examiner* — Thomas Dougherty
*Assistant Examiner* — Karen B Addison
(74) *Attorney, Agent, or Firm* — Blakely, Sokoloff, Taylor & Zafman LLP

(57) ABSTRACT

Multi-layered thin film piezoelectric material stacks and devices incorporating such stacks. In embodiments, an intervening material layer is disposed between two successive piezoelectric material layers in at least a portion of the area of a substrate over which the multi-layered piezoelectric material stack is disposed. The intervening material may serve one or more function within the stack including, but not limited to, inducing an electric field across one or both of the successive piezoelectric material layers, inducing a discontinuity in the microstructure between the two successive piezoelectric materials, modulating a cumulative stress of the piezoelectric material stack, and serving as a basis for varying the strength of an electric field as a function of location over the substrate.

14 Claims, 10 Drawing Sheets

(56) References Cited

U.S. PATENT DOCUMENTS

| | | |
|---|---|---|
| 2005/0237858 A1 | 10/2005 | Thomenius et al. |
| 2005/0248235 A1 | 11/2005 | Namerikawa et al. |
| 2005/0248238 A1 | 11/2005 | Yamada et al. |
| 2007/0013269 A1* | 1/2007 | Huang .................. B06B 1/0292 310/334 |
| 2007/0259468 A1 | 11/2007 | Chen et al. |
| 2008/0042519 A1 | 2/2008 | Marshall et al. |
| 2008/0048211 A1 | 2/2008 | Khuri-Yakub et al. |
| 2009/0230820 A1 | 9/2009 | Nudelman et al. |
| 2012/0206014 A1 | 8/2012 | Bibl et al. |
| 2012/0235539 A1 | 9/2012 | Bibl et al. |
| 2012/0299439 A1 | 11/2012 | Huang |
| 2013/0000758 A1 | 1/2013 | Hoen et al. |

OTHER PUBLICATIONS

"PCT, International Search Report and Written Opinion of the International Searching Authority for International Application No. PCT/US2014/065964", (Feb. 23, 2015), Whole Document.

International Preliminary Report on Patentability from PCT/US2014/043893 mailed Mar. 3, 2016, 11 pgs.

Non-Final Office Action from U.S. Appl. No. 14/103,672 mailed Feb. 12, 2016, 13 pgs.

International Preliminary Report on Patentability for PCT International Application No. PCT/US2014/065964 mailed Jun. 14, 2016, 6 pgs.

\* cited by examiner

MULTI-LAYERED THIN FILM PIEZOELECTRIC DEVICES AND METHODS OF MAKING THE SAME

TECHNICAL FIELD

Embodiments of the invention generally relate to piezoelectric devices, and more specifically pertain to thin film piezoelectric actuators and transducers.

BACKGROUND

Piezoelectric devices find many applications as electromechanical actuators and transducers. Piezoelectric devices may be further classified as either employing a bulk piezoelectric material, or a piezoelectric thin film. A bulk piezoelectric material generally has a thickness over 20 microns (μm), and often well over 50 μm, while thin film devices employ a piezoelectric membrane that is less than 15 μm in thickness.

Generally, physical displacement of a piezoelectric material in the presence of an electric field of a given strength is a function of the thickness of the piezoelectric film. One technique in the art to increase displacement in a bulk piezoelectric device 100 is depicted in FIG. 1. The bulk device 100 utilizes a plurality of bulk piezoelectric material slabs 135A, B, C (e.g., with $T_1$ of each slab being >50 μm in (z) thickness) stacked up in an alternating manner with a plurality of electrodes 110, 120, 130, 140. As further shown in FIG. 1, voltage biasing of the electrodes is such that the electric field applied across each successive piezoelectric slab is in an opposite direction as that of the subjacent and superjacent slab. For example, at a given instant in time a positive voltage is applied to electrodes 110 and 130 while a negative voltage is applied to electrodes 120 and 140. This biasing may be used first to pole the bulk piezoelectric slabs into opposing polarization (e.g., slabs 135A and 135C having polarization $P_1$ in a first direction, and slab 135B having a polarization $P_2$ in second direction opposite $P_1$ and $P_3$). This same biasing may then be used to impart a time varying electric field across the slabs that induces a large cumulative physical displacement.

Thin film piezoelectric devices can be advantageously fabricated inexpensively to exceedingly high dimensional tolerances using various micromachining techniques (e.g., material deposition, lithographic patterning, feature formation by etching, etc.). As such, one or more piezoelectric thin film device may be fabricated into Microelectromechanical systems (MEMS) that may further include one or more integrated circuit (IC) fabricated with compatible techniques. As one example, a microfluidic device, including one or more fluidic chambers and piezoelectric pumping actuators, can be formed in a single printer head die. As another example, an ultrasonic transducer, including an array of piezoelectric membranes capable of generating a high frequency pressure wave in a propagation medium (e.g., air, water, or body tissue) in contact with an exposed outer surface of the transducer element, can be formed in a single MEMS transducer die.

One issue with conventional thin film piezoelectric materials is that the thickness of piezoelectric thin film material may be limited by one or more aspects of the thin film fabrication process (e.g., film deposition constraints). Thus, the relationship between displacement of the piezoelectric material in the presence of an electric field of a given strength and the thickness of the piezoelectric film may not be readily exploited in the same manner as for the bulk piezoelectric device 100. As such, limitations on the thickness of the piezoelectric thin film can limit the performance of a thin film piezoelectric device. Structures and techniques that enable greater piezoelectric thin film thicknesses, and therefore enable greater degrees of freedom with respect to designed membrane displacement, are therefore commercially advantageous.

SUMMARY

Multi-layered thin film piezoelectric material stacks and devices incorporating such stacks are described herein. The thin film piezoelectric material stacks are disposed over a substrate, such as, but not limited to a semiconductor wafer. In embodiments, the piezoelectric material layers in a multi-layered stack have substantially the same composition across all piezoelectric layers. For certain such embodiments, an intervening material layer is disposed between two successive piezoelectric material layers in at least a portion of the area of a substrate over which the multi-layered piezoelectric material stack is disposed. The intervening material may serve one or more function within the stack including, but not limited to, inducing an electric field across one or both of the successive piezoelectric material layers, inducing a discontinuity in the microstructure between the two successive piezoelectric materials, modulating a cumulative stress of the piezoelectric material stack, and serving as a basis for varying the strength of an electric field as a function of location over the substrate.

In embodiments, a thin film piezoelectric material stack includes at least a first and second piezoelectric material layer having anisotropic polarization with poles oriented in substantially the same direction for both layers. In embodiments, thin film piezoelectric material stack includes at least a first and second piezoelectric material layer having columnar polycrystalline microstructure.

In embodiments, a multi-layered thin film piezoelectric material stack includes at least three conductive electrode layers including at least one inner electrode layer disposed between two piezoelectric material layers. For certain such embodiments, at least one outer electrode layer is disposed on a side of at least one of the piezoelectric layers opposite of the inner electrode layer. In one such embodiment, a first piezoelectric material layer is disposed between the inner electrode layer and a lower electrode layer while a second piezoelectric material layer is disposed over the inner electrode layer. In another such embodiment, the second piezoelectric material layer is disposed between the inner electrode layer and an upper electrode layer with the first piezoelectric material layer is disposed under the inner electrode layer. In a third such embodiment, the first piezoelectric material layer is between the inner electrode layer and an lower electrode layer while a second piezoelectric material layer is disposed between the inner electrode layer an a upper electrode layer.

In embodiments, a multi-layered thin film piezoelectric material stack is displaced through application of a time varying voltage across two of three electrodes while the third electrode is biased so as to drop approximately half of the electric field across two layers of piezoelectric material. In certain such embodiments, the third of the three electrodes is maintained at a fixed or time varying bias potential. In one such embodiment, the bias potential is intermediate of peak-to-peak voltages applied across the two electrodes over an entire phase of the time varying drive voltage. In embodiments, a fixed ground potential is maintained while the time varying voltages applied to the driven electrodes vary symmetrically with respect to ground potential.

In embodiments, a piezoelectric micromachined transducer array, for example suitable for the ultrasonic band, includes a plurality of transducer elements, each of which includes a multi-layered piezoelectric thin film stack. In embodiments, a piezoelectric fluidic pumping array, for example suitable for use in a print head, includes a plurality of pumping chambers, each of which are in fluid communication with a multi-layered piezoelectric thin film stack.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specifically denoted as being mutually exclusive.

The term "coupled" is used herein to describe functional or structural relationships between components. "Coupled" may be used to indicate that two or more elements are in either direct or indirect (with other intervening elements between them or through the medium) mechanical, acoustic, optical, or electrical contact with each other, and/or that the two or more elements co-operate or interact with each other (e.g., as in a cause and effect relationship).

The terms "over," "under," "between," and "on" as used herein refer to a relative position of one component or material layer with respect to other components or layers where such physical relationships are noteworthy for mechanical components in the context of an assembly, or in the context of material layers of a micromachined stack. One layer (component) disposed over or under another layer (component) may be directly in contact with the other layer (component) or may have one or more intervening layers (components). Moreover, one layer (component) disposed between two layers (components) may be directly in contact with the two layers (components) or may have one or more intervening layers (components). In contrast, a first layer (component) "on" a second layer (component) is in direct contact with that second layer (component).

It is to be understood that while the various embodiments described herein are all presented in a context directly applicable to a microfluidic pumping apparatus or a pMUT array, one or more of the structures or techniques disclosed may be applied to other types of thin film piezoelectric devices. Thus, while the model embodiments have certain synergies and attributes, the disclosure herein has a far broader applicability.

Figure 1:
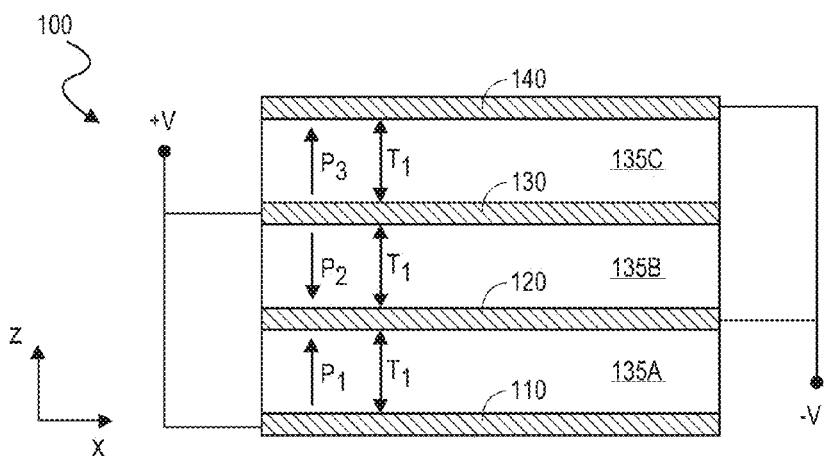
FIG. 1 is a cross-sectional view of a conventional bulk piezoelectric device employing a plurality of piezoelectric slabs.
Figure 2:
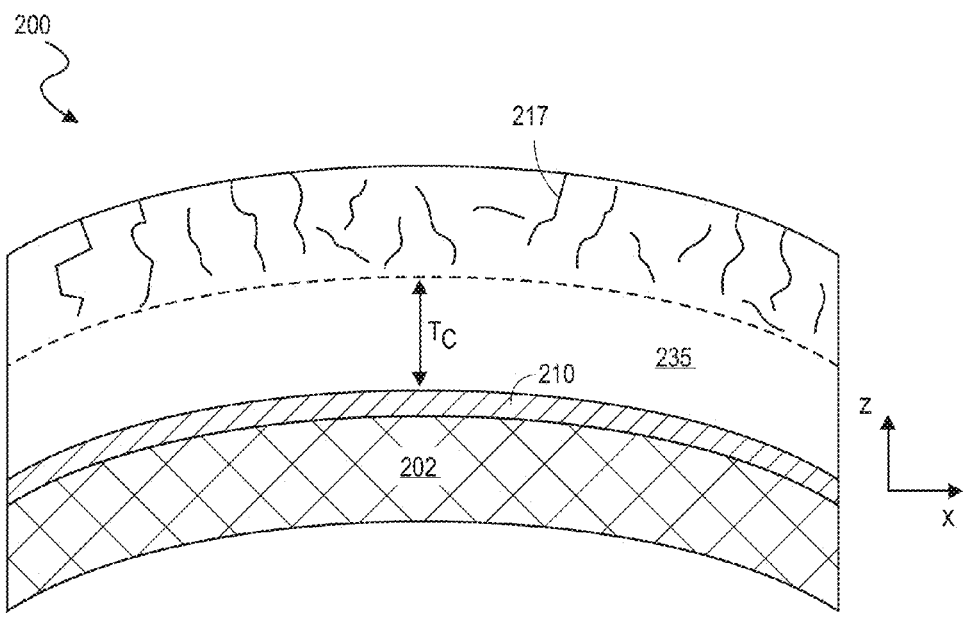
FIG. 2 is a cross-sectional view of a thin film piezoelectric device having a piezoelectric material thickness that exceeds a critical thickness.

FIG. 2 is a cross-sectional view of a thin film piezoelectric device 200 having a piezoelectric material thickness that exceeds a critical thickness, $T_c$. Generally, the thin film device 200 includes a substrate 202, which may be any substrate conventional to thin film piezoelectric devices. More specifically, the substrate 202 may include one or more material layers, each of any thickness (e.g., thin film or bulk slab materials), but in combination serve as a means of mechanical support to the multi-layer thin film piezoelectric stack. For example, the substrate 202 may include one or more thin films, such as dielectrics, disposed over a bulk slab material, such as a semiconductor (e.g., crystalline silicon) wafer. Other bulk materials, such as glass, or sapphire may also be utilized. As described further elsewhere herein, films within the substrate 202 may include templating features over which the thin film piezoelectric stack is deposited so as to affect the structure or profile shape of the piezoelectric stack. Disposed over the substrate 202 is a bottom electrode 210, which may comprise one or more metals in laminated and/or alloyed form. Generally, the electrode layer 210 may be any known in the art to be suitable for forming an overlying piezoelectric material with suitable dipole characteristics. More specifically, the electrode layer 210 may include one or more metal and/or metal oxide thin film layer providing good mechanical adhesion to piezoelectric material and provide suitable conductivity to insure impedance across the area of the electrode layer 210 is sufficiently small for the piezoelectric device 301 to function. In further embodiments, the electrode layer 210 includes an inert noble metal with high temperature stability and suitable microstructure to promote textured growth of the piezoelectric layer 235. In embodiments, at least the surface of the electrode layer 210 interfacing with the piezoelectric material layer 235 has crystal texture (the distribution of crystallographic orientations in a polycrystalline material) where the preferred orientation is (111). Such texture has been found to promote desired microstructure in the piezoelectric layer 235. Exemplary interfacial electrode layer materials include Pt, Ni, and Ir, alloys thereof (e.g., IrTiW, TiPt, etc.), and oxides thereof (e.g., $IrO_2$, $NiO_2$, $PtO_2$, etc.). In further embodiments where the electrode layer 210 is a composite stack, a layer of Pt, Ir, an alloy thereof, or oxide thereof, is disposed over a Ti, W, or TiW layer, which provides good conductivity and is typically of relatively low stress (e.g., <200 MPa). While the total thickness of the electrode layer 210 may vary, an exemplary range is 0.1-0.2 μm.

Disposed on the bottom electrode 210 is a thickness of piezoelectric material forming the thin piezoelectric layer 235. Generally, the piezoelectric film layer 235 may be of any composition known to have crystal forms lacking inversion symmetry (i.e., are polarized), and thereby display the solid-state charge-stress relationship known as the piezoelectric effect. In the exemplary embodiment the piezoelectric material layer 235 is Lead Zirconate Titanate (PZT), and more particularly polycrystalline PZT having crystal texture that favors the perovskite structure. Various dopants may be included in the PZT, such as, but not limited to, niobium.

The piezoelectric layer 235 is generally deposited using some technique typical of thin film processing, such as, but not limited to, RF magnetron, reactive physical vapor deposition (PVD). The deposition process and the interface of surface of the bottom electrode 210 have a significant impact on the composition and microstructure of the piezoelectric layer 235 and while good piezoelectric properties have been achieved for a nominal piezoelectric layer thickness, it has been further found by the inventors that when the deposition thickness exceeds a critical thickness, the physical and/or electrical properties of the deposited film degrades. For example, large stress (e.g., >1 GPa) present in the piezoelectric layer 235 can bow the substrate (a compressive stress is illustrated in FIG. 2) and/or induce cracks 217 throughout the thickness of the layer 235 after exceeding a threshold. As another example, break down voltage has found to drop when the piezoelectric layer 235 has too great of thickness. The inventors have found that grain size of columnar PZT increases with increasing thickness of the piezoelectric layer 235. Although not bound by theory, it is currently theorized that the larger grain boundaries that form as grain size increases results in the cracks and breakdown voltage degradation that is seen with layers that are sputter deposited to thicknesses over the critical thickness.

In embodiments, a thin film piezoelectric stack includes at least a pair of thin film piezoelectric layers separated by an intervening material layer. Generally, the intervening layer may serve one or more function within the piezoelectric material stack including, but not limited to, inducing an electric field across one or both of the successive piezoelectric material layers, inducing a discontinuity in the microstructure between the two successive piezoelectric material layer, modulating a cumulative stress of the piezoelectric material stack, and serving as a basis for varying the strength of an electric field across the two piezoelectric material layers as a function of location over the substrate.

Figure 3A:
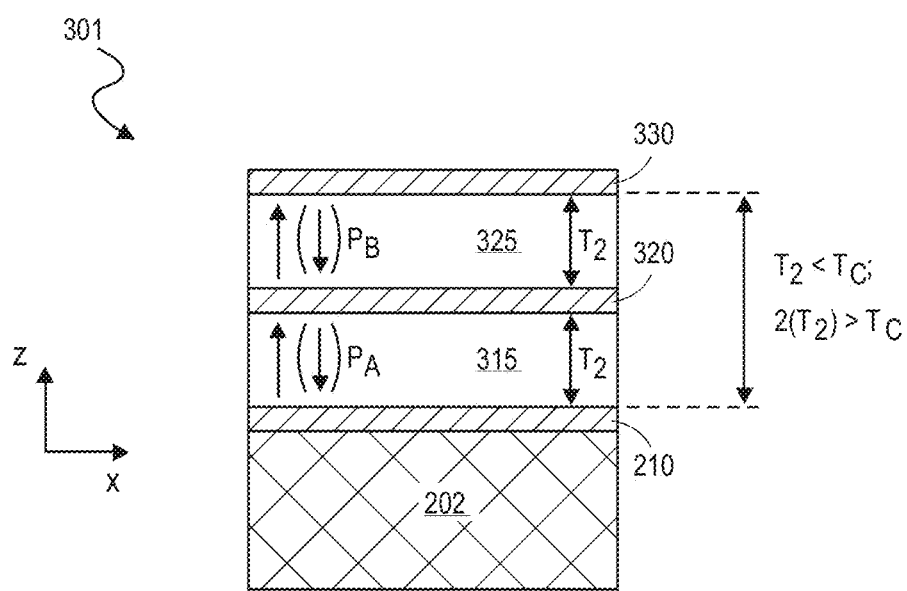
FIG. 3A is a cross-sectional view of a multi-layered thin film piezoelectric device employing an intervening material layer, in accordance with an embodiment of the present invention.

FIG. 3A is a cross-sectional view of one such multi-layered thin film piezoelectric device 301 employing first and second piezoelectric thin film layers 315, 325 separated by an intervening material layer 320, in accordance with an embodiment. Generally, each of the piezoelectric materials layers 315, 325 have a thickness (e.g., $T_2$) that is below the critical thickness $T_c$ (e.g. 4 μm), but their combined thickness is greater than $T_c$, thereby making a greater total thickness of piezoelectric available to the micromachining techniques leveraged in thin film piezoelectric devices. This greater total thickness may in turn provide a larger electromechanical response by the piezoelectric device 301 than otherwise possible with a reduced thickness of thin film piezoelectric material. The thicknesses of the layers 315, 325 may differ and the upper limit on thickness may be dependent on the film composition as well as the position of the film layer within the stack. For example, the second piezoelectric layer 325 may have reduced thickness relative to the piezoelectric layer 315, and a third piezoelectric layer (not depicted in FIG. 3A) might have a thickness reduced relative to the piezoelectric layer 325, etc. In embodiments, each of the piezoelectric layers 315, and 325 has a thickness below 10 μm, advantageously 1-4 μm for PZT embodiments, and most advantageously about 1-2 μm for PZT embodiments displaying highest breakdown voltages. Hence, for the bi-layer stack including the piezoelectric layers 315 and 325, the total piezoelectric thickness may be 4 μm, or more, while overcoming the limitations described for single layers in the context of FIG. 2. Indeed, this approach has achieved in certain embodiments a total PZT thicknesses of up to 8 μm with no film cracking and breakdown voltages remaining sufficiently high for any application into at least the 6-7 μm range. For example, sputtered piezoelectric films may have breakdown voltages greater than or equal to 1 MV/cm for thicknesses less than Tc, and less than or equal to 500 kV/cm for thicknesses greater than Tc. By comparison, bulk PZT may have breakdown voltages on the order of a few hundred kV/cm. Notably, because the multi-layered structure depicted in FIG. 3A can be fabricated with highly conformal and controlled processes (e.g., PVD), membranes of any size, shape, or surface topography (e.g., flat surface, domes, dimpled, etc.) may be fabricated. Therefore, substantially any device employing a single thin film piezoelectric layer can be fabricated with a multi-layered stack, such as that depicted in FIG. 3A. In addition, sputtered piezoelectric layers can have higher Curie temperatures than bulk or sol-gel piezoelectric layers. For example, sputtered piezoelectric layers can withstand processing temperatures up to about 500° C. without depoling versus around 200° C. for bulk and sol-gel piezoelectric layers.

As shown in FIG. 3A, a multi-layer thin film piezoelectric stack is disposed over a first region of a supporting substrate 202, which may be any of those substrates described in the context of FIG. 2 as the same reference number is retained throughout this description for structures having like properties. Disposed over the substrate 202 is a first electrode layer 210 having any of those compositions and structures previously described. The multi-layered piezoelectric stack is disposed on (i.e., in direct or intimate contact with) the electrode layer 210. In embodiments, the first and second piezoelectric thin film layers 315, 325 may be of a same or different composition. In the exemplary embodiment all the piezoelectric layers within a stack are PZT. However, in other embodiments, at least one of the piezoelectric material layers may have another composition, such as but not limited to, III-N materials, such as aluminum nitride (AlN) and gallium nitride (GaN), both of which display piezoelectric effect when in the wurtzite structure. In still other embodiments, $BaTiO_3$, or even polyvinylidene difluoride (PVDF) polymer particles may be utilized in one or more of the piezoelectric layers 315 and 325.

In embodiments, the piezoelectric layers within the multi-layered stack all have the same direction of polarization. For exemplary embodiments where the electrode layer 210 provides an interface with (111) texture and the piezoelectric layer 315 is PZT, the piezoelectric layer 315 has a columnar microstructure relative to the substrate 202 and this film, as deposited in FIG. 3A, has permanent polarization. With permanent polarization, no poling is performed to induce the piezoelectric effect in contrast to a bulk material or sol-gel. Sputtered piezoelectric layers are poled as they are deposited (e.g. by PVD) on an electrode layer 210. More specifically, the polarization field within the piezoelectric layer 315 has a direction (orientation) that is perpendicular to the substrate 202. The perpendicular polarization field may be in one of the two directions perpendicular to the substrate 202, as denoted by the polarization field arrows $P_A$ in FIG. 3A. Likewise, the perpendicular polarization field within the piezoelectric layer 325 is also in one of the two directions perpendicular to the substrate 202, as denoted by the polarization field arrows $P_B$ in FIG. 3A.

Disposed over the piezoelectric layer 325 is a second, or "top" electrode material layer 330, which may include any of the same materials and/or structures described for the electrode 210. For example, in one embodiment a noble metal layer, such as one containing any of Au, Pt, or Ir, is disposed on the surface of the piezoelectric layer 325. In exemplary embodiments, a Ti, W, or TiW layer is disposed underneath the noble metal layer, for example to provide good adhesion to the piezoelectric layer. While the total thickness of the top electrode material layer 330 may vary, an exemplary range is 0.1-0.2 μm.

Disposed between the piezoelectric layers 315, 325 is an intervening layer 320. The intervening layer 320 is generally of a different composition than that of piezoelectric layers 315, 325. In further embodiments, the intervening layer 320 is a material that disrupts the grain structure of the piezoelectric material layer 315, but serves as a good interface with both the piezoelectric material layers 315 and 325. Disruption of the grain structure is to limit the grain/boundary size within the piezoelectric layer 325. The intervening layer 320 has good adhesion to both the piezoelectric material layers 315 and 325 and further provides an interface to the piezoelectric material layer 325 that promotes the crystallinity desired for piezoelectricity (e.g., perovskite where the piezoelectric layer 325 is PZT). Exemplary intervening materials include those utilized for the interface of the piezoelectric material layer 315 and the electrode layer 210, such as, but not limited to, Pt, Ni, and Ir, alloys thereof (e.g., IrTiW, TiPt, etc.), and oxides thereof (e.g., $IrO_2$, $NiO_2$, $PtO_2$, etc.). While thickness of the intervening layer 320 may vary, exemplary thicknesses are below 0.15 μm and may be as low as few tens of nanometers.

Figure 3B:
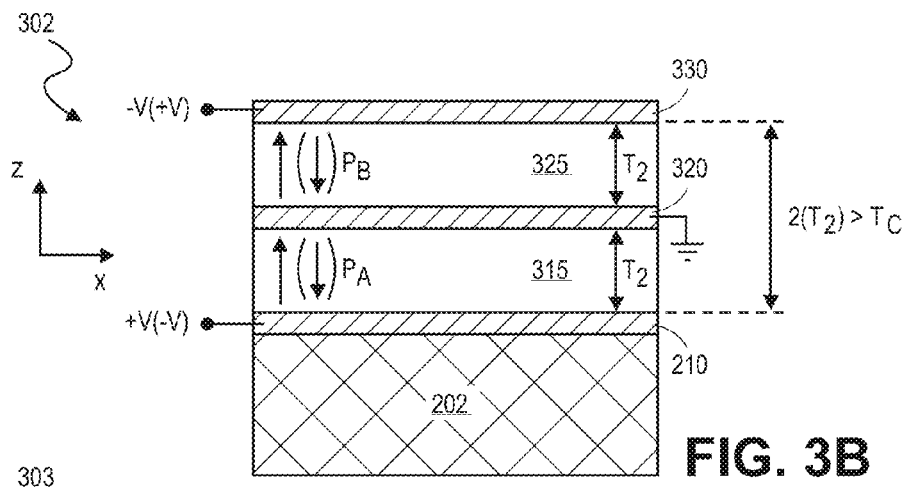
FIG. 3B is a cross-sectional view of a multi-layered thin film piezoelectric device employing an intervening electrode, in accordance with an embodiment.

In embodiments, the intervening layer 320 further serves as an inner electrode comprising conductive material capable of sustaining a voltage different than that of the electrode 210. FIG. 3B is a cross-sectional view of a multi-layered thin film piezoelectric device 302 employing such an intervening electrode, in accordance with an embodiment. As such, the device 302 retains the properties of the device 301 with the additional aspect that the intervening layer 320 is to sustain a bias or reference voltage potential relative to the electrodes 210 and 330, which in this context are referred to herein as "outer" electrodes while the intervening layer 320 is an "inner" electrode. In certain such embodiments, intervening layer 320 comprises a Pt, Ni, and Ir, alloy thereof, and oxide thereof (e.g., $IrO_2$, $NiO_2$, $PtO_2$), in intimate contact with both the piezoelectric layer 315 and 325. Such layers are further separated by a an intervening metal layer with greater bulk conductivity, lower stress, or otherwise satisfying one or more other electrode design criteria. For example, a Ti, W, or TiW material may be inserted between two Ir, or Ir oxide, layers, one that interfaces to the piezoelectric layer 315, and the other that interfaces to the piezoelectric layer 325. While thickness of the intervening layer 320 when further serving as an inner electrode may vary, exemplary thicknesses are between 0.1 μm and 0.2 μm.

FIG. 3B further illustrates an electrical drive signal suitable for a multi-layered piezoelectric stack where both piezoelectric thin films have the same direction of polarization. Generally, the inner electrode(s) are to be at a potential that is intermediate to the peak-to-peak voltages applied across the outer electrodes. This intermediate potential may be maintained over the entire phase of the time varying voltage applied across the outer electrodes. As shown in FIG. 3B, where the electrode layer 210 is driven to a positive peak voltage (+V) and the electrode layer 330 is driven to a negative peak voltage (−V) the intervening layer 320 is an electrode layer maintained at ground potential. As the time varying drive voltage changes phase with electrode layer 210 and the negative peak voltage (−V) and the electrode layer 330 at the positive peak voltage (+V), the electric field applied across each of the piezoelectric layers 315 and 325 remains oriented in the same direction so that the electromechanical effects of each piezoelectric layer are in phase with the other.

Figure 3C:
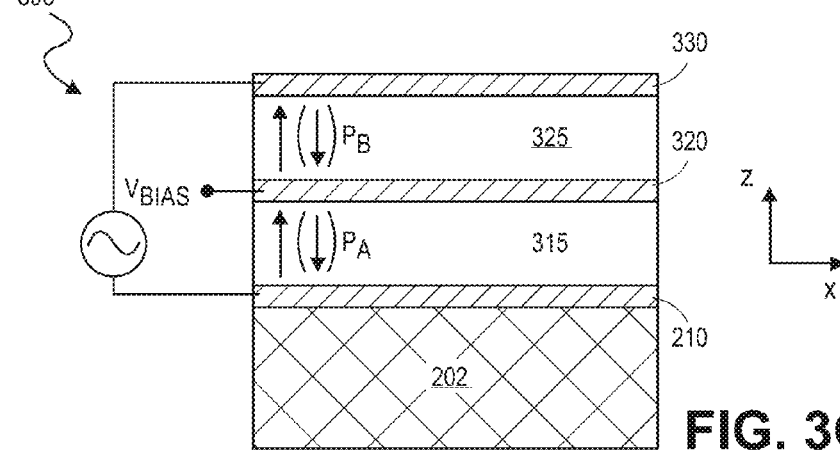
FIG. 3C is a cross-sectional view of the multi-layered thin film piezoelectric device of FIG. 3B further illustrating an operational biasing of the intervening electrode, in accordance with an embodiment.

FIG. 3C is a cross-sectional view of the multi-layered thin film piezoelectric device 303 that has substantially the same structure as that described for FIG. 3B, but further illustrates an operational biasing of the intervening layer 320, in accordance with an embodiment. With a time varying voltage applied across the outer electrodes 210, 330, the intervening layer 320 is driven with a DC bias potential, $V_{bias}$, that is intermediate to the peak voltages of the time varying voltage source. Depending on the embodiment, $V_{bias}$ may be a fixed or varying positive and/or negative voltage with respect to a ground reference potential.

Figure 3D:
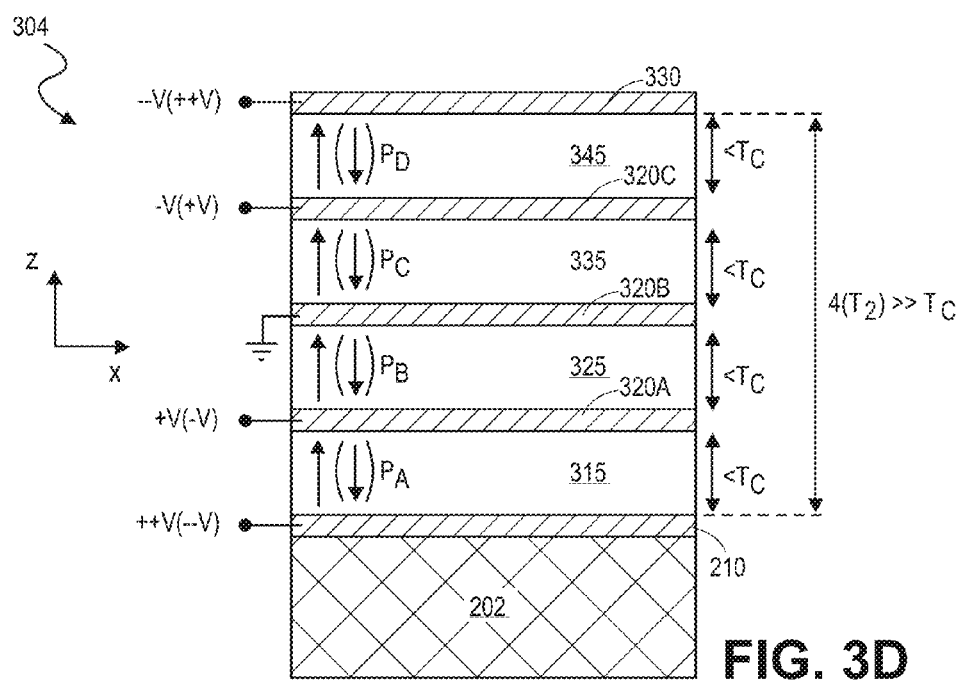
FIG. 3D is a cross-sectional view of a multi-layered thin film piezoelectric device employing a plurality of intervening material layers.

In embodiments, a multi-layered piezoelectric thin film stack includes a plurality of intervening layers, at least two of which are separated by an intervening piezoelectric layer. FIG. 3D is a cross-sectional view of a multi-layered thin film piezoelectric device 304 employing a plurality of intervening material layers 320A, 320B, and 320C. As depicted, the device 304 employs an extension of the bi-layered piezoelectric stack depicted in the device 302 to illustrate how an even greater piezoelectric thicknesses may be achieved while still maintaining film quality. FIG. 3D further illustrates how a plurality of intervening layers may be electrically driven following the guideline that inner electrodes are driven/biased so as to ensure a portion of the field generated across the outer electrodes 210, 330 is dropped across the each of piezoelectric thin film layers 315, 325, 335, 345. For such embodiments, the composition and thicknesses of the piezoelectric thin film layers 335 and 345 may be any of those described elsewhere herein for the layers 315 and 325, for example to have all piezoelectric layers 315-345 of a same composition and thickness (e.g., all being less than the critical thickness $T_c$), although the composition and thickness might also vary across the piezoelectric film layers. Likewise, each of the intervening layers 320A, 320B, and 320C may have any of the compositions described elsewhere for the intervening layer 320. For example, in one embodiment each intervening layer forms an Ir or Ir oxide interface with the adjacent piezoelectric layers. As shown in FIG. 3D, the polarization direction in each piezoelectric film layer 315, 325, 335, 345 is the same, and permanent, (e.g., each being an RF magnetron reactive sputter-deposited PZT). For such embodiments where each intervening layer further functions as an inner electrode, the electrical drive signal to the various electrodes may take the form further illustrated in FIG. 3D where the voltage potentials applied to the inner electrodes increment between peak voltages applied across the outer electrodes 210, 330. For example, a resistor network may be utilized to induce a first IR drop between the electrode 210 and intervening layer 320A and induce a second IR drop (e.g., equal to that of the first IR drop) between the electrode 330 and intervening layer 320C. The intervening electrode 320B may then be maintained at ground potential, as depicted, or otherwise biased appropriately relative to the time varying voltages applied so as to align the electric fields across the piezoelectric material layers 325 and 335 with those across the piezoelectric material layers 315 and 345.

In embodiments, the intervening layer spans a smaller area than does at least one of a lower electrode, an upper electrode, and/or the adjacent piezoelectric layers. For such embodiments, one piezoelectric layer is disposed directly on another piezoelectric layer where the intervening layer is absent. Such embodiments may achieve many, if not all, of the benefits of the stacked multi-layered piezoelectric structures described herein even though in certain device regions the layered piezoelectric comprises two material layers that may be of substantially the same composition in direct contact and with a total thickness that exceeds the critical thickness where properties of a continuous film degrade.

Figure 4A:
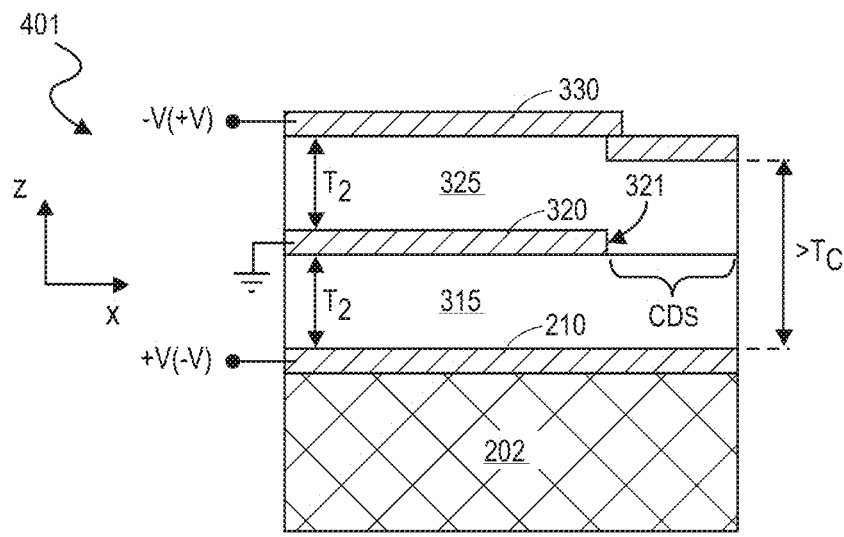
FIG. 4A is a cross-sectional view of a multi-layered thin film piezoelectric device employing a patterned intervening layer, in accordance with an embodiment.

FIG. 4A is a cross-section view of a multi-layered thin film piezoelectric device 401 employing a patterned intervening layer 320, in accordance with an embodiment. As shown, with patterning, the intervening layer 320 spans only a portion of the surface area (x-y plane) of the substrate 202 that is covered by the electrode 210, where layers 315, 325 are in contact with one another in a region of no more than a critical dimension $CD_s$ which is at least equal to the thickness of one of the piezoelectric layers (e.g. layer 325 in this example). The contact region being less than CDs in length reduces the possibility of voids between layers 315, 325. The adhesion provided by the presence of intervening layer 320, albeit in reduced proportion relative to the embodiments depicted in FIGS. 3A-3C, and/or beneficial grain discontinuity, and/or strain concentration or other mode of piezoelectric stress reduction imparted by the intervening layer edge 321 may permit the piezoelectric material to achieve the greater combined thickness without detrimental effects of cracking, etc.

With patterned intervening layers, multiple device design approaches are possible. In first embodiments, the patterned intervening layer may serve as a basis for varying the strength of an electric field as a function of location over the substrate 202. For example, the patterned intervening layer may be biased relative to the outer electrodes so as to induce the entire electric field across only one of the first and second piezoelectric materials, while in regions where the intervening layer is absent the field will drop across the total thickness of both first and second piezoelectric materials. In second embodiments, a piezoelectric membrane may be made that includes three or more electrodes (e.g., two outer and one inner electrode) in only a portion of the membrane area, such as one continuous inner portion, or one continuous peripheral portion. In third embodiments, a piezoelectric membrane may include only two electrodes (e.g., top and bottom electrodes) but with an intervening material in a continuous inner or peripheral portion, or in discontinuous portions of the membrane area. In such embodiments, the intervening material may enable a thicker piezoelectric material in spaces between regions where there is an intervening material.

Figure 4B:
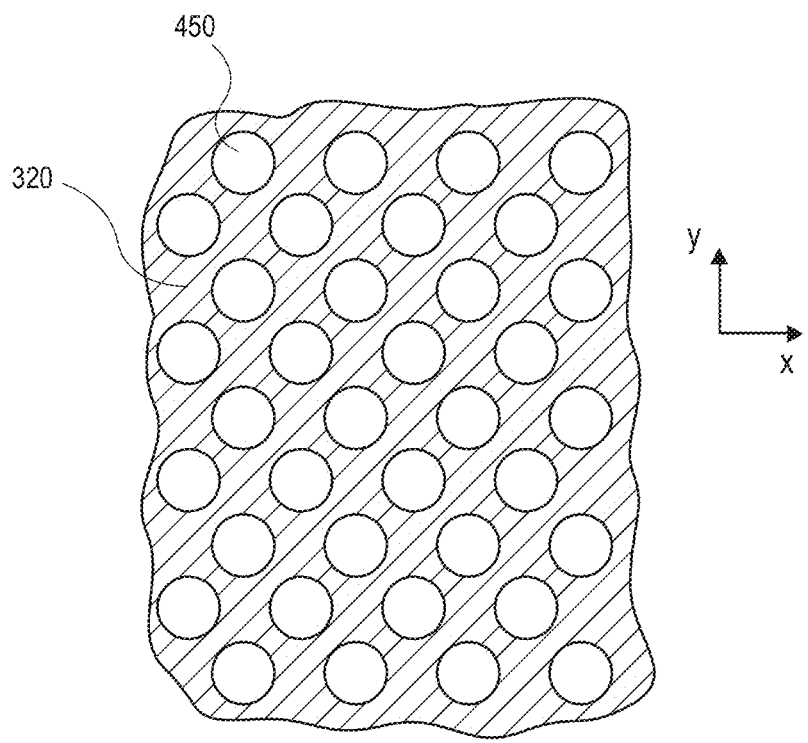
FIG. 4B is a plan view of the patterned intervening layer in the multi-layered thin film piezoelectric device depicted in FIG. 4A, in accordance with an embodiment.

FIG. 4B is a plan view of the patterned intervening layer 320 of the multi-layered thin film piezoelectric device 401, in accordance with embodiments. As shown, the patterned intervening layer 320 forms a mesh of electrically continuous material, which, for example, may be biased to a reference (ground) potential as depicted in FIG. 4A. The structure of patterned intervening layer 320 may also serve to reduce stress of the piezoelectric stack, for example. In second embodiments above, the device 401 may then include a piezoelectric membrane that spans a plurality of the openings 450. In the third embodiments above where the patterned intervening layer 320 is not electrically biased or driven (i.e., is electrically floating), the area depicted in FIG. 4B may span a plurality of piezoelectric devices with a single piezoelectric membrane formed with double thickness at each opening 450. In one such embodiment, a first outer electrode (e.g., 210) may then be a continuous film over the substrate 202 and electrically grounded, while a second outer electrode (e.g., 330) is patterned to be present at least in the region of the opening 450 (e.g., having a critical dimension comparable to $CD_s$ in FIG. 4A). In this embodiment, assuming the critical dimension of the region where the piezoelectric layers 315, 325 are in direct contact can be as large as the dimension of the piezoelectric membrane needed for the device application (e.g., $CD_s$>CD of one membrane), the addition of the patterned intervening layer 320 amounts only to an extra film deposition and patterning operation relative to a conventional single piezoelectric film layer with design and operation of the membrane be nearly the same as that of a continuous double thickness of piezoelectric material.

Figure 5:
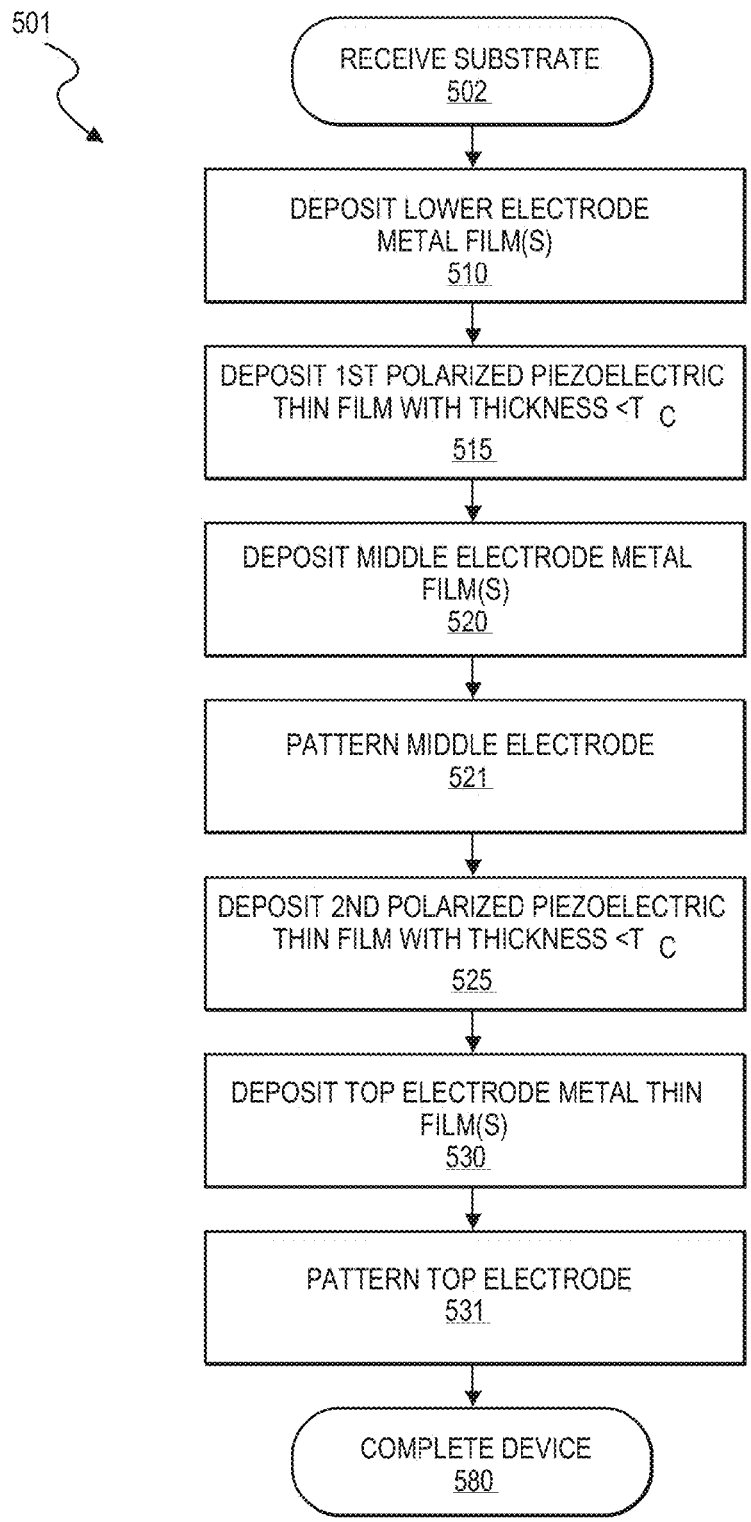
FIG. 5 is a flow diagram illustrating a method of fabricating a multi-layered thin film piezoelectric device, in accordance with an embodiment.

FIG. 5 is a flow diagram illustrating a method 501 of fabricating a multi-layered thin film piezoelectric device, in accordance with an embodiment. The method 501 begins at operation 502 with receipt of a suitable substrate, such as any of those described elsewhere herein in the context of substrate 202. At operation 515, a lower electrode metal thin film layer or stack is deposited, by any of PVD, chemical vapor deposition (CVD), or atomic layer deposition (ALD). In one exemplary embodiment, PVD is employed to deposit a metal stack including a Ti, W, or TiW layer and a noble metal interface layer, such as Pt, Ir, or Ir oxide, disposed on the Ti, W, or TiW layer.

At operation 515, a first polarized piezoelectric thin film is deposited directly on the noble metal interface of the lower electrode to a thickness below the threshold, or critical thickness. For the exemplary PZT embodiment, a PVD process is utilized at operation 515. More specifically, PZT is deposited with an RF magnetron reactive PVD process performed at an elevated temperature (e.g., greater than 400° C.). With such a process, the PZT as-deposited is polarized and has a high Curie temperature (e.g., more than 100° C. higher than a conventional films requiring poling).

The method 501 proceeds to operation 520 where an intervening layer is deposited. In embodiments, the intervening layer includes a noble metal layer such as Pt, or Ir, or Ir oxide, disposed on the piezoelectric material formed at operation 515. In further embodiments where the operation 520 is to form a middle, or inner, electrode metal thin film, a greater conductive metal thickness is achieved through PVD of a first noble metal layer such as, but not limited to, Pt, Ir, or Ir oxide, followed by PVD deposition of W, Ti, or TiW layer, which is then followed by a PVD of a second noble metal layer such as, but not limited to, Pt, Ir, or Ir oxide.

In certain embodiments, the middle electrode metal thin film layer(s) is then patterned at operation 521, for example with any conventional photolithography and etch process. The patterning reduces the area of the middle electrode to be less than the area occupied by the piezoelectric material formed at operation 515. In other words, the patterning operation 521 exposes a portion of the first piezoelectric layer. At operation 525 a second polarized piezoelectric thin film is deposited to a thickness below some threshold, or critical thickness ($T_c$). In the exemplary embodiment, operation 525 is essentially a repetition of the operation 521, depositing the same material (e.g., PZT) to a same thickness (e.g., 2-4 μm).

The method 501 then proceeds to operation 530 where a top (upper) electrode metal thin film is deposited. In one exemplary embodiment, operation 530 entails PVD deposition of a noble metal layer such as, but not limited to, Au, Pt, Ir, or Ir oxide, deposited on a W, or TiW layer, also deposited by PVD. In certain embodiments, the top electrode metal thin film layer(s) is then patterned at operation 531, for example with any conventional photolithography and etch process. The patterning reduces the area of the top electrode to be less than the area occupied by the piezoelectric material formed at operation 525. In other words, the patterning operation 531 exposes a portion of the second piezoelectric layer. In certain such embodiments, the upper electrode is patterned to be disposed within a region where the first and second piezoelectric films are in direct contact (e.g., as depicted in FIG. 4A). Notably, depending on the number of piezoelectric thin films in a given stack, the operations 525-531 may be repeated cyclically until a desired total thickness of piezoelectric material is obtained. Of further note, in alternate embodiments the lower electrode may be patterned just as described for the top electrode in addition to, or instead of, the patterning operation 531. Once the multi-layered piezoelectric stack is fully formed, the method 501 then proceeds with completion of the particular device at operation 580 according to conventional practices.

Figure 6A:
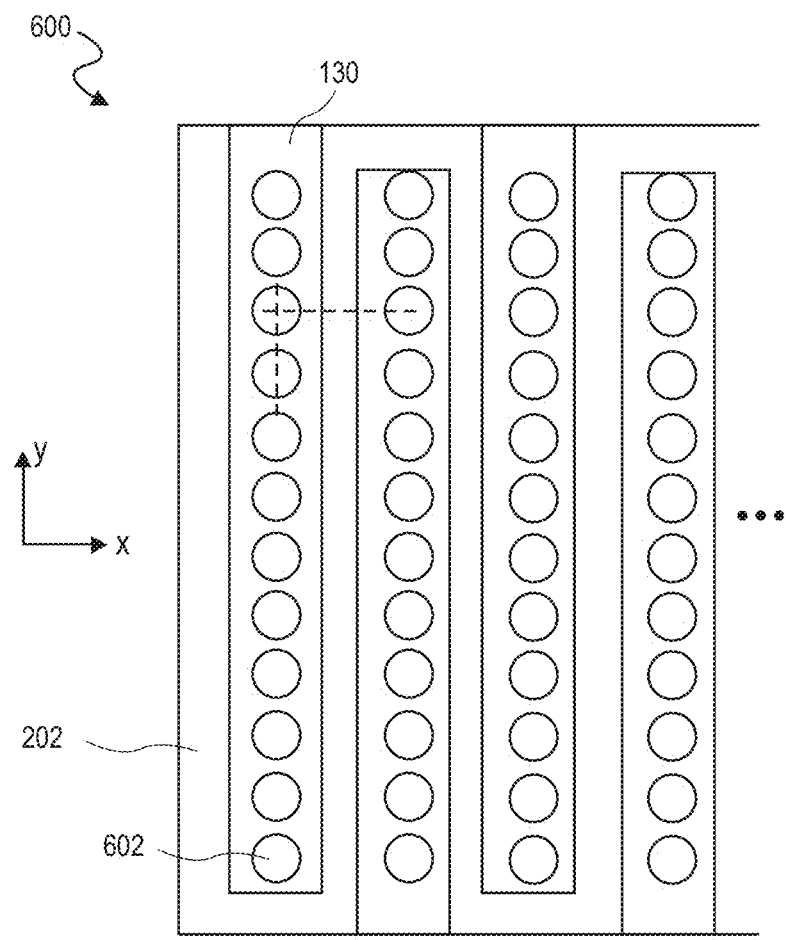
FIG. 6A is a plan view of a piezoelectric micromachined ultrasonic transducer (pMUT) array employing a multi-layered thin film piezoelectric membrane in one or more transducer elements, in accordance with an embodiment.
Figure 6B:
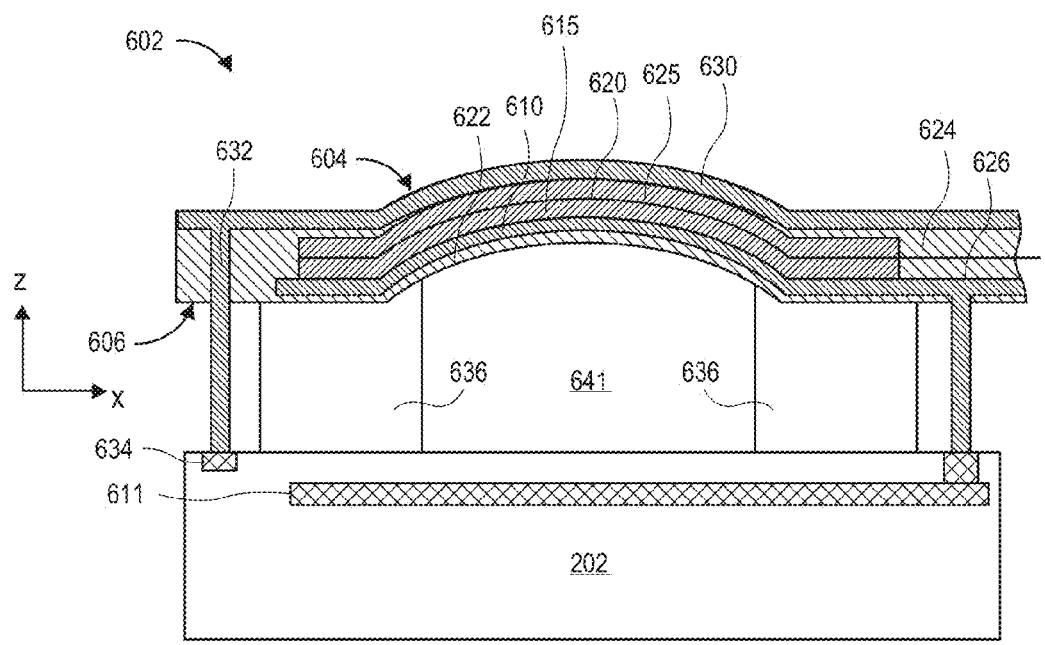
FIG. 6B is a cross-sectional view of a pMUT transducer element employing a multi-layered thin film piezoelectric membrane, in accordance with an embodiment.
Figure 6C:
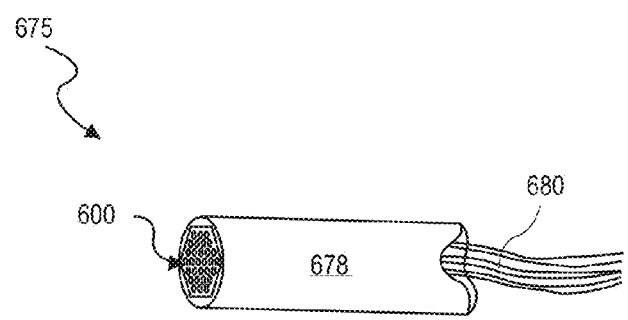
FIG. 6C is a schematic of an ultrasonic transducer apparatus employing a pMUT array having multi-layered thin film piezoelectric membranes, in accordance with an embodiment.

FIG. 6A is a plan view of a pMUT array 600, in accordance with an embodiment. FIG. 6B is a cross-sectional view of a pMUT transducer element employing a multi-layered thin film piezoelectric membrane that is used in the array 600, in accordance with an embodiment. FIG. 6C is a schematic of an ultrasonic transducer apparatus employing the pMUT array 600.

Referring first to FIG. 6A, the array 600 includes a plurality of drive/sense electrode stacks 130 disposed over an area defined by a first dimension, x and a second dimension y, of the substrate 202. The drive/sense electrode rail stack 130 repeats an interdigitated electrode layout with additional cells forming a 1D electrode array of arbitrary size (e.g., 128, 256, etc.). Each of the drive/sense electrode rail stacks is electrically addressable independently from any other drive/sense electrode rail stacks arrayed over the substrate 202.

In an embodiment, a pMUT array includes a plurality of piezoelectric transducer element populations. Each piezoelectric transducer element population operates as a group associated with a frequency response that is a composite of the individual transducer elements 602 within each element population. In embodiments, each piezoelectric transducer element 602 includes a multi-layered thin film piezoelectric membrane. While the piezoelectric membrane may generally be of any shape conventional in the art, in exemplary embodiments the piezoelectric membrane has rotational symmetry. For example, in the pMUT array 600, each transducer element 602 includes a piezoelectric membrane having a circular geometry. The piezoelectric membrane may further be a spheroid with curvature in a third (z) dimension to form a dome (as further illustrated by FIG. 6B), or a dimple. Planar membranes are also possible. The drive/sense electrode rail stack, which may include an inner electrode 620 in some embodiments, and a multi-layered piezoelectric membrane, is depicted in the cross-sectional view of FIG. 6B.

In the context of FIG. 6B, exemplary micromachined (i.e., microelectromechanical) aspects of individual transducer elements are briefly described. It is to be appreciated that the structures depicted in FIG. 6B are included primarily as context for particular aspects of the present invention and to further illustrate the broad applicability of the present invention with respect to piezoelectric transducer element structure. In FIG. 6B, a convex transducer element 602 includes a top surface 604 that during operation forms a portion of a vibrating outer surface of the pMUT array 600. The transducer element 602 also includes a bottom surface 606 that is attached to a top surface of the substrate 202. The transducer element 602 includes a convex or dome-shaped multi-layered piezoelectric membrane including thin film layers 615 and 625 disposed on either side of the inner electrode 620 and further surrounded by the drive/sense electrodes 610 and 630. In one embodiment, the multi-layered piezoelectric membrane can be formed by depositing (e.g., sputtering) piezoelectric material particles in uniform layer 615, 625 on a profile-transferring substrate (e.g., photoresist) that has a dome formed on a planar top surface, for example.

Further as shown in FIG. 6B, in some implementations, the transducer element 602 can optionally include a thin film layer 622, such as silicon dioxide that can serve as a support and/or etch stop during fabrication. A dielectric membrane 624 may further serve to insulate the various vertically stacked electrode metallization. A vertically-oriented electrical interconnect 626 connects the drive/sense electrode 610 to drive/sense circuits via the drive/sense electrode rail 611. A similar interconnect 632 connects the electrode 630 while the inner electrode 620 may be patterned (e.g., in the y-dimension) to couple multiple transducer element inner electrodes to a same bias/reference potential. An annular support 636, surrounding a cavity 641 with an axis of symmetry defining a center of the transducer element 602, mechanically couples the multi-layered piezoelectric membrane to the substrate 202. The support 636 may be of any conventional material, such as, but not limited to, silicon dioxide, polycrystalline silicon, polycrystalline germanium, SiGe, and the like. Exemplary thicknesses of support 636 range from 10-50 μm and exemplary thickness of the membrane 624 range from 2-20 μm.

FIG. 6C is a functional block diagram of an ultrasonic transducer apparatus 675 that employs the pMUT array 600, in accordance with an embodiment of the present invention. In an exemplary embodiment, the ultrasonic transducer apparatus 675 is for generating and sensing pressure waves in a medium, such as water, tissue matter, etc. The ultrasonic transducer apparatus 675 has many applications in which imaging of internal structural variations within a medium or multiple media is of interest, such as in medical diagnostics, product defect detection, etc. The apparatus 675 includes at least one pMUT array 600, which may be any of the pMUT arrays described elsewhere herein having any of the transducer element and element population attributes described. In exemplary embodiment, the pMUT array 600 is housed in a handle portion 678 which may be manipulated by machine or by a user of the apparatus 675 to change the facing direction and location of the outer surface of the pMUT array 600 as desired (e.g., facing the area(s) to be imaged). Electrical connector 680 electrically couple channels of the pMUT array 600 to a communication interface external to the handle portion 678.

Figure 7:
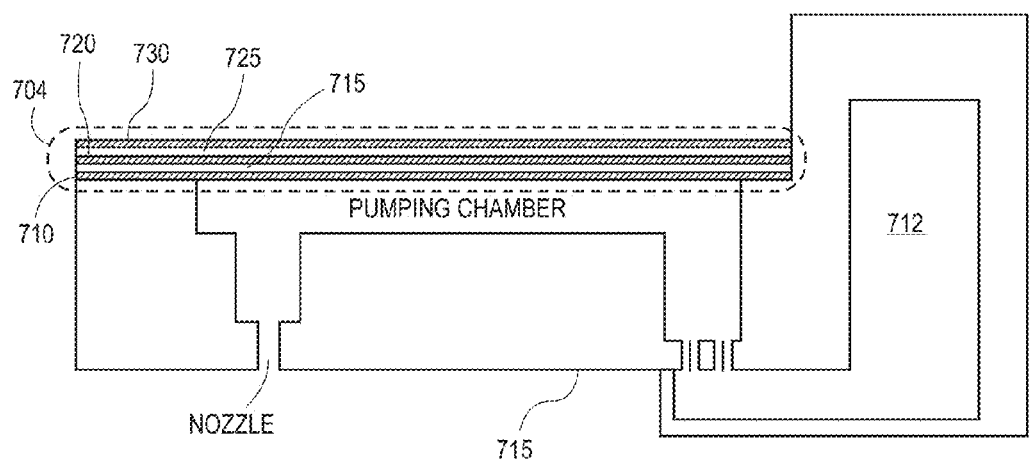
FIG. 7 is a cross-sectional view of a micromachined piezoelectric fluidic pumping apparatus, in accordance with an embodiment of the present invention.

FIG. 7 is a cross-sectional view of a micromachined piezoelectric fluidic pumping apparatus, in accordance with an embodiment of the present invention. In this example, ink is provided by a frame flow path 712 that leads to the bottom surface 715 of the substrate. Acoustic energy is applied to the ink pumping chamber by a multi-layered thin film piezoelectric membrane 704. In this exemplary embodiment, the membrane 704 includes first and second piezoelectric thin film layers 715 and 725 separated by an intervening material layer 720 (which may further function as an inner electrode). During operation, electrodes 710 and 730 are driven with a time vary voltage (e.g., pulse) that displaces the membrane 704 relative to the bottom surface 715 and thereby displaces ink from within the pumping chamber out of the nozzle, and/or from within the flow path 712 into the pumping chamber. Depending on the embodiment, any of the multi-layered thin film piezoelectric membranes described elsewhere herein may be utilized for the membrane 704.

Figure 8A:
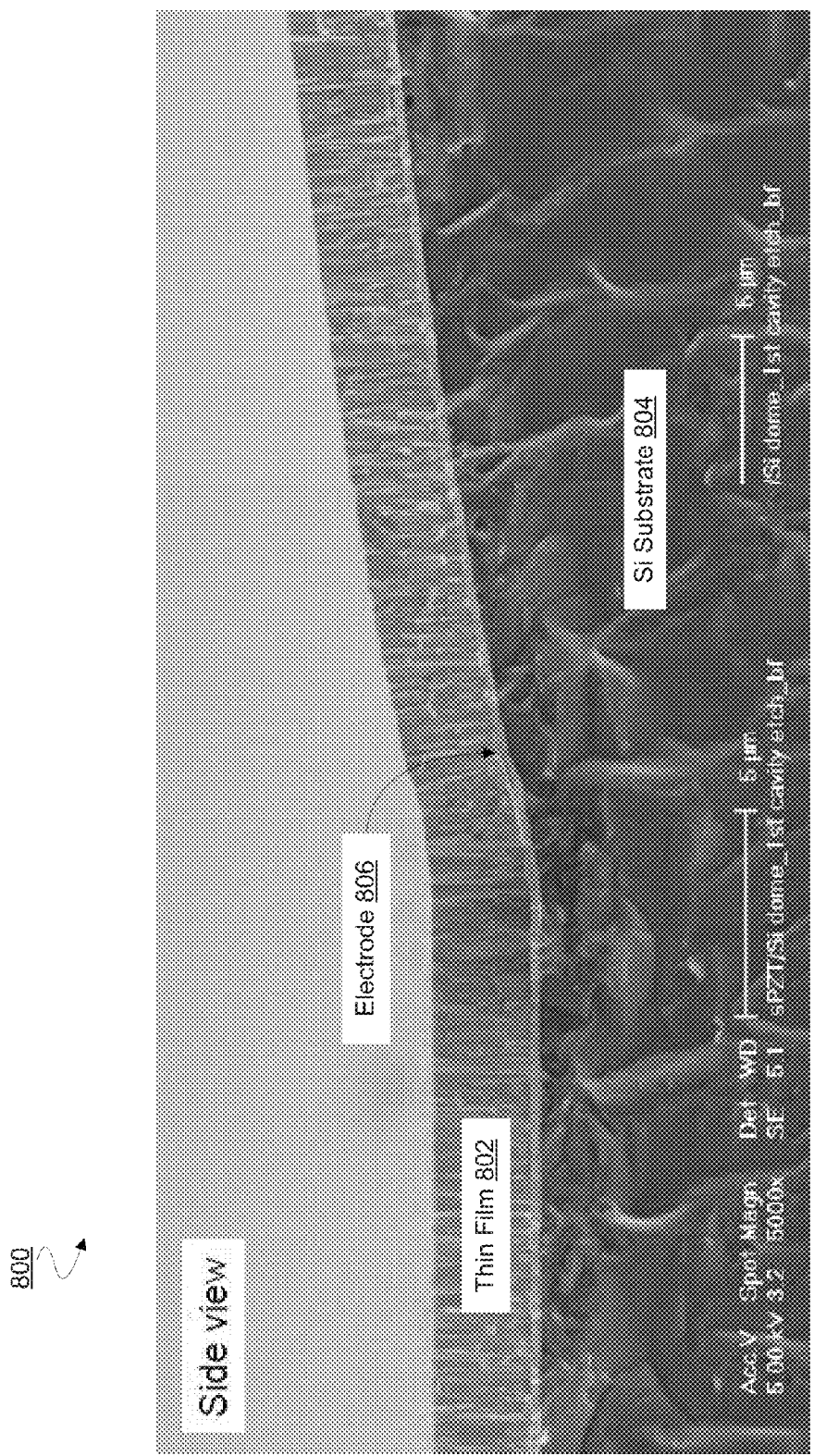
FIGS. 8A, 8B and 8C are respective cross-sectional views of a sputtered thin film piezoelectric device in accordance with an embodiment.
Figure 8B:
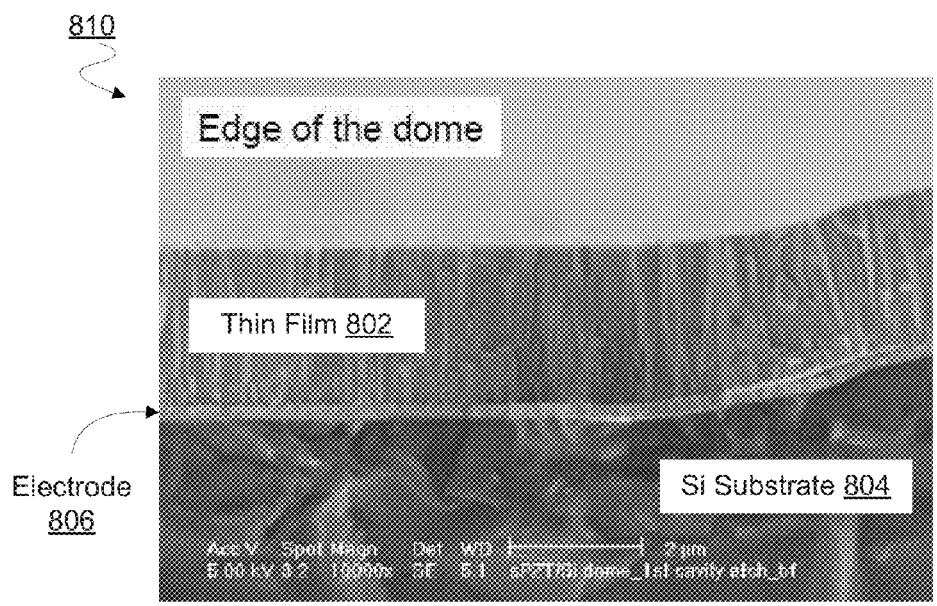
Figure 8C:
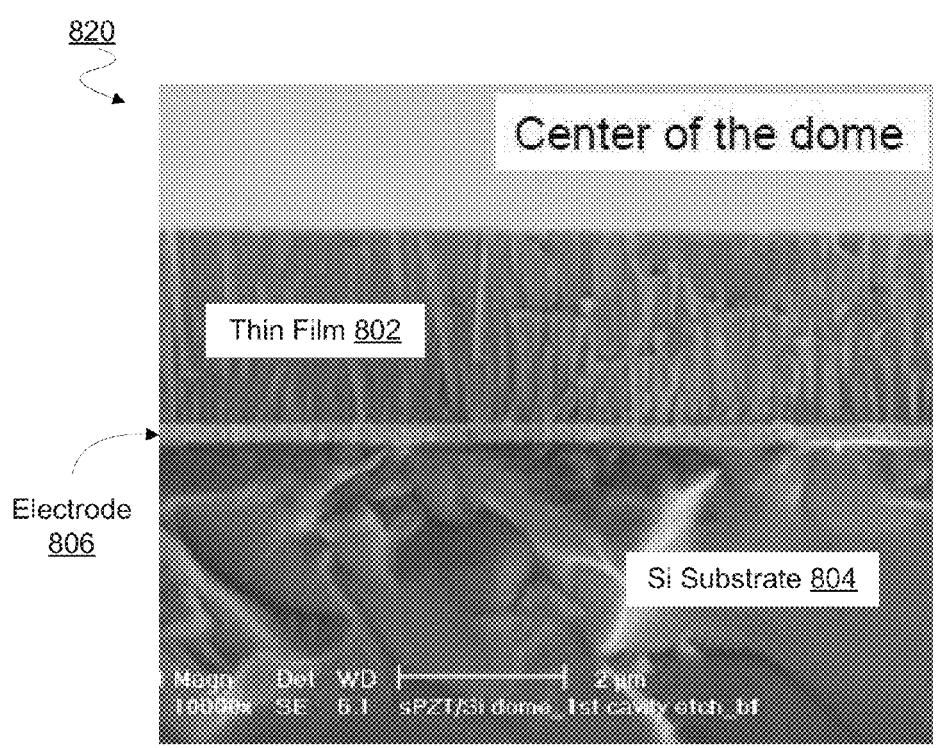

FIGS. 8A, 8B and 8C show respective cross-sectional views 800, 810, 820 of a sputtered thin film piezoelectric device having a columnar structure according to an embodiment. The device variously represented in views 800, 810, 820 may have some or all of the features of a sputtered thin film piezoelectric device discussed herein. For example, such a device may include features variously found in some or all of piezoelectric devices 302, 303, 304, transducer element 602 and/or the like.

As shown in view 800, a silicon substrate 804 of the device may have disposed thereon an electrode 806 and a piezoelectric thin film 802. Although certain embodiments are not limited in this regard, thin film 802 forms at least part of a dome structure over a bump in substrate 804. View 810 provides a more detailed view of one edge of the dome structure, and view 820 provides a more detailed view of the center of the dome structure. In certain embodiments, additional processing—subsequent to the stage of processing represented in views 800, 810, 820—may be performed to alter on some or all of thin film 802, substrate 804 and electrode 806.

Views 800, 810, 820 variously show that piezoelectric thin film 802 has polycrystalline microstructures which are substantially columnar, relative to the surface of substrate 804. As discussed herein, grain size of columnar PZT increases with increasing thickness of the piezoelectric layer, and the larger grain boundaries that form as grain size increases have been associated with cracks and breakdown voltage degradation for PZT layers that are sputter deposited to thicknesses over a critical thickness.

While many embodiments have been described, it is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A thin film piezoelectric device, comprising:
a piezoelectric element including:
 a lower electrode disposed over a first region of a substrate;
 a first piezoelectric layer having a first polarization disposed over the lower electrode;
 a second piezoelectric layer having the first polarization disposed over the first piezoelectric layer;
 an intervening layer disposed between the first and second piezoelectric layers in at least a portion of the first region, wherein the intervening layer is of a different composition than that of the first and second piezoelectric layers; and
 an upper electrode disposed over the second piezoelectric layer;
wherein the piezoelectric element is in fluid communication with a pumping chamber, or wherein the piezoelectric element is disposed over a sealed cavity of an ultrasonic transducer.

2. The device of claim 1, wherein the intervening layer is an inner electrode comprising conductive material capable of sustaining a voltage different than that of either the lower or upper electrode.

3. The device of claim 1, wherein the intervening layer includes at least one of Pt, Ir, an alloy thereof, or an oxide thereof in direct contact with both the first and second piezoelectric layers.

4. The device of claim 3, wherein each of the first and second piezoelectric layers comprise PZT, and wherein both of the lower electrode and intervening layer further comprises a Pt or Ir containing layer disposed in direct contact with a piezoelectric layer.

5. The device of claim 1, wherein the first and second piezoelectric layers comprise PZT of 2-8 µm in thickness.

6. The device of claim 1, wherein the first and second piezoelectric layers comprise PZT of 2-4 µm in thickness.

7. The device of claim 1, wherein the intervening layer is one of a plurality of intervening layers separated by an intervening piezoelectric layer.

8. The device of claim 1, wherein the intervening layer spans a smaller area than does at least one of the upper and lower electrodes, and wherein the second piezoelectric layer is disposed directly on the first piezoelectric layer in a portion of the first region where the intervening layer is absent.

9. A piezoelectric apparatus, comprising
a substrate;
an array of piezoelectric elements disposed over the substrate, wherein each piezoelectric element comprises:
   a first electrode disposed over a first region of a substrate;
   a first piezoelectric layer having a first polarization disposed over the first electrode;
   a second piezoelectric layer having the first polarization disposed over the first piezoelectric layer; and
   an intervening layer disposed between the first and second piezoelectric layers in at least a portion of the first region, wherein the intervening layer is of a different composition than that of the first and second piezoelectric layers; and
   a second electrode disposed over the second piezoelectric layer;
wherein each piezoelectric element is in fluid communication with a pumping chamber of a respective microfluidic device, or each piezoelectric element is disposed over a sealed cavity of a respective ultrasonic transducer.

10. The apparatus of claim 9, wherein the intervening layer spans a smaller area than does the first electrode, and wherein the second piezoelectric layer is disposed directly on the first piezoelectric layer in a portion of the first region where the intervening layer is absent.

11. The apparatus of claim 10, wherein at least one of the first and second electrode is patterned to be disposed in an area where the intervening layer is absent.

12. A method comprising:
operating a piezoelectric element of a thin film piezoelectric device, the piezoelectric element including:
   a lower electrode disposed over a first region of a substrate;
   a first piezoelectric layer having a first polarization disposed over the lower electrode;
   a second piezoelectric layer having the first polarization disposed over the first piezoelectric layer;
   an intervening layer disposed between the first and second piezoelectric layers in at least a portion of the first region, wherein the intervening layer is of a different composition than that of the first and second piezoelectric layers; and
   an upper electrode disposed over the second piezoelectric layer;
wherein operating the piezoelectric element includes:
   driving a time varying voltage across the upper electrode and the lower electrode to place an electric field across the first piezoelectric layer and the second piezoelectric layer; and
   biasing the inner electrode;
wherein the piezoelectric element is in fluid communication with a pumping chamber, or wherein the piezoelectric element is disposed over a sealed cavity of an ultrasonic transducer.

13. The device of claim 12, wherein the lower, inner, and upper electrodes are driven to place substantially equal electric fields oriented in a same direction across each of the first and second piezoelectric layers.

14. The device of claim 12, wherein each of the upper and lower electrodes are driven with a time varying voltage source having a peak-to-peak voltage, and wherein the inner electrode is maintained at a voltage intermediate of the time varying voltage over an entire phase of the time varying voltage.

* * * * *